(12) United States Patent
Shimazawa et al.

(10) Patent No.: US 6,255,814 B1
(45) Date of Patent: Jul. 3, 2001

(54) METHOD AND APPARATUS FOR MEASURING BIAS MAGNETIC FIELD FOR CONTROLLING MAGNETIC DOMAIN OF MAGNETORESISTIVE EFFECT ELEMENT

(75) Inventors: Koji Shimazawa; Satoru Araki, both of Tokyo (JP)

(73) Assignee: TDK Corporation, Tokyo (JP)

(*) Notice: Subject to any disclaimer, the term of this patent is extended or adjusted under 35 U.S.C. 154(b) by 0 days.

(21) Appl. No.: 09/368,672

(22) Filed: Aug. 5, 1999

(30) Foreign Application Priority Data

Aug. 11, 1998 (JP) ................................. 10-237959

(51) Int. Cl.[7] ................................................ G01R 33/02
(52) U.S. Cl. ...................................... 324/252; 360/327.33
(58) Field of Search ............................. 324/207.21, 252, 324/210–213; 360/313, 324, 324.1, 324.11, 327, 327.31, 327.3, 327.33; 338/32 R (56) References Cited

U.S. PATENT DOCUMENTS

| | | | |
|---|---|---|---|
| 5,206,590 | 4/1993 | Dieny et al. | 324/252 |
| 5,422,571 | 6/1995 | Gurney et al. | 324/252 |
| 5,508,866 | * 4/1996 | Gill et al. | 360/327.2 |

* cited by examiner

*Primary Examiner*—Jay Patidar
(74) *Attorney, Agent, or Firm*—Arent Fox Kintner Plotkin & Kahn PLLC (57) ABSTRACT

A method for measuring bias magnetic field for controlling magnetic domain (longitudinal bias magnetic field) of a MR element has the step of applying an external measurement magnetic field onto the MR element which is biased with the magnetic field for controlling the magnetic domain (longitudinal bias magnetic field) in parallel to the direction of the bias magnetic field, the step of measuring ρ-H loop of the MR element (output resistance of MR element versus magnetic field strength loop) under the application of the external measurement magnetic field, and the step of determining a shifted amount of the measured ρ-H loop.

16 Claims, 10 Drawing Sheets

METHOD AND APPARATUS FOR MEASURING BIAS MAGNETIC FIELD FOR CONTROLLING MAGNETIC DOMAIN OF MAGNETORESISTIVE EFFECT ELEMENT

FIELD OF THE INVENTION

The present invention relates to a measurement method and an apparatus to measure bias magnetic field for controlling magnetic domain of a magnetoresistive effect (MR) element biased with magnetic domain control field, particularly to a measurement method and an apparatus to measure bias magnetic field for controlling magnetic domain of spin valve MR elements and tunnel magnetoresistive effect (TMR) elements, which are biased with exchange coupling magnetic field by anti-ferromagnetic material.

DESCRIPTION OF THE RELATED ART

Recently, MR thin-film read sensors based on spin valve effect of giant magnetoresistance effect (GMR) characteristics are proposed (U.S. Pat. Nos. 5,206,590 and 5,422,571) in order to satisfy the requirement for ever increasing data storage densities in today's magnetic storage systems like hard disk drive units.

The spin valve effect thin-film structure includes first and second thin-film layers of a ferromagnetic material separated by a thin-film layer of non-magnetic metal material, and an adjacent layer of anti-ferromagnetic material which is formed in physical contact with the second ferromagnetic layer to provide exchange bias magnetic field by exchange coupling at the interface of the layers. The magnetization direction in the second ferromagnetic layer is constrained or maintained by the exchange coupling, hereinafter the second ferromagnetic layer is called "pinned" layer. On the other hand, the magnetization direction of the first ferromagnetic layer is free to rotate in response to an externally applied magnetic field, hereinafter the first ferromagnetic layer is called "free" layer. The direction of the magnetization in the free layer changes between parallel and anti-parallel against the direction of the magnetization in the pinned layer, and hence the magneto-resistance greatly changes and giant magnetoresistance effect (GMR) characteristics are obtained.

The output characteristics of the spin valve MR read sensor depends upon the angular difference of magnetization between the free and pinned layers. Assuming the angular difference is θ, the relative output of the MR read sensor is given by Output=$(1-\cos\theta)/2$. By this equation, the best output waveform with good symmetry can be obtained at the condition of θ=90 degrees as an initial condition of the angular difference. Therefore, in a spin valve MR element the magnetization directions of the pinned and free layers are adjusted to be orthogonal each other by applying a bias magnetic field. In an initial condition, the magnetization direction of the free layer is set toward the track width direction by the bias magnetic field for controlling the magnetic domains in the free layer. On the other hand, the magnetization direction of the pinned layer is set toward the direction perpendicular to the track width direction (MR height direction) by the exchange coupling magnetic field by the anti-ferromagnetic material layer.

In a MR element, to suppress Barkhousen noise due to non-continuous magnetization by fluctuations or displacements of the magnetic domain boundaries, the bias magnetic field (longitudinal bias magnetic field) for controlling the magnetic domains is applied toward the longitudinal direction (track width direction). If this longitudinal bias magnetic field applied to the free layer is small, Barkhousen noise will be easily occurred. If the longitudinal bias magnetic field is large, the change in the magnetization direction of the free layer becomes difficult causing the sensing sensitivity of the spin valve MR element to be degraded. Therefore, it is necessary to apply an optimum amount of the longitudinal bias magnetic field in a spin valve MR element. In order to implement it, it is very important to know the strength of the longitudinal bias magnetic field of each element and the distribution on a wafer.

There are well known methods of measuring such longitudinal bias magnetic field in anisotropic magnetoresistive (AMR) elements. FIGS. 1a to 1d show a measurement method of the longitudinal bias magnetic field in the AMR element.

Figure 1A:
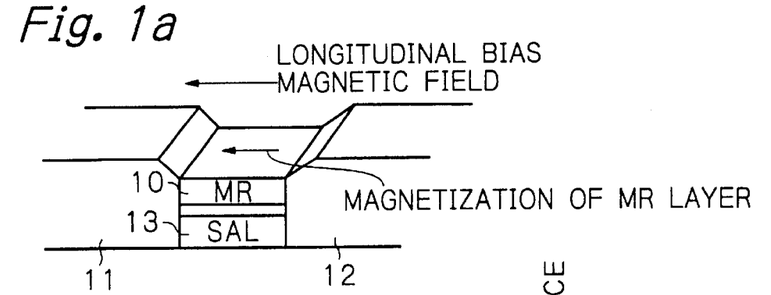
FIGS. 1a to 1d, already described, illustrate a conventional method of measuring bias magnetic field for controlling magnetic domain of a MR element.

FIG. 1a shows the magnetization direction of MR layer 10 at an initial condition with no sense current $I_s$. The MR layer 10 is magnetized toward the direction of the longitudinal bias magnetic field applied by hard magnets 11 and 12.

Figure 1B:
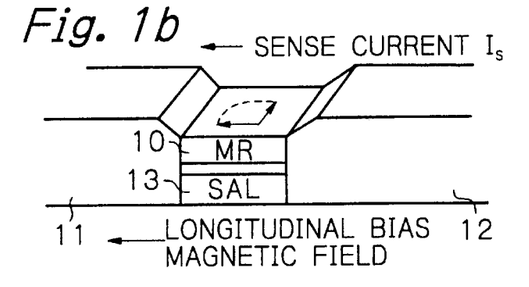
Figure 1B:
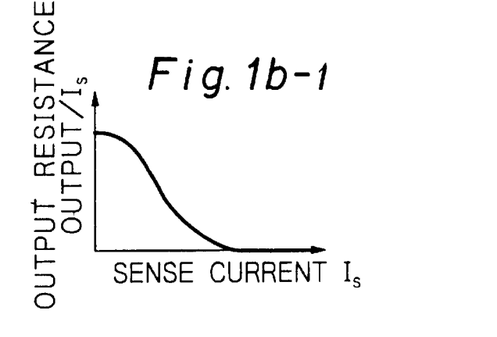

As shown in FIG. 1b, when a sense current $I_s$ is forced to flow, the magnetic field induced by the sense current $I_s$ magnetizes a SAL (soft adjacent layer) 13. The static magnetic field (transverse bias magnetic field) by the magnetized SAL 13 is applied to the MR layer 10, and hence the magnetization direction of the MR layer 10 gradually shifts toward the MR height direction (transverse direction) in accordance with the increase of the sense current $I_s$. Therefore, as shown in this figure, the output resistance (OUTPUT/$I_s$) of the AMR element does strongly depend on the sense current $I_s$.

Figure 1C:
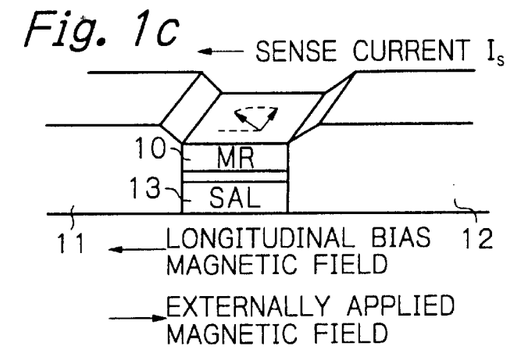
Figure 1C:
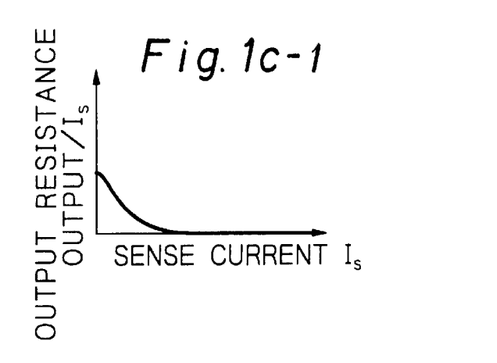

As shown in FIG. 1c, when an external magnetic field in opposite direction to the longitudinal bias magnetic field by the hard magnets 11 and 12 is applied, the longitudinal bias magnetic filed is offset and the MR layer is much more affected by the transverse bias magnetic field due to the sense current $I_s$, and the magnetization direction of the MR layer 10 is much more rotated toward the MR height direction. Thus, the output resistance dependency on the sense current $I_s$ becomes smaller.

Figure 1D:
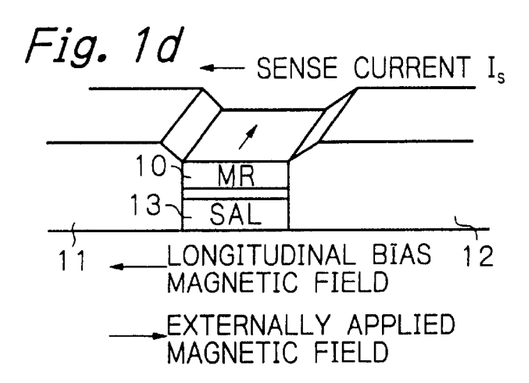
Figure 1D:
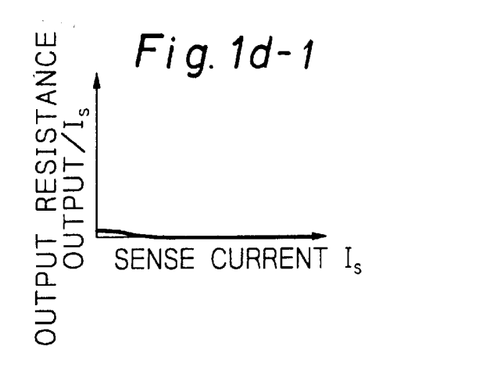

As shown in FIG. 1d, if the externally applied magnetic field becomes much larger, an AMR element's output resistance dependency on the sense current $I_s$ becomes very small or minimum. Therefore, applying an external magnetic field in opposite direction to the longitudinal bias magnetic field and measuring the output resistance under comparatively small sense current, and by adjusting the strength of the external magnetic field so that the output resistance becomes minimum, the strength of the longitudinal bias magnetic field can be determined from the applied external magnetic field at that point.

This conventional measurement method of the longitudinal bias magnetic field is effective for the AMR element. However, it is impossible to apply this method to GMR elements like spin valve MR elements by the structure of pinned and free layers of which principles of operation are quite different from that of the conventional AMR elements. Also, this conventional method can be applied to only a MR element with no shield layer. In case of a MR element with shield layers, since the shield layers absorb the external magnetic field, correct value of the longitudinal bias magnetic field cannot be measured.

As explained above, there has been no way to measure the longitudinal bias magnetic field strength of GMR elements like spin valve MR elements and of TMR elements.

SUMMARY OF THE INVENTION

It is therefore an object of the present invention to provide a method and an apparatus for accurate measuring a bias magnetic field (longitudinal bias magnetic field) for controlling magnetic domains in a MR element biased with exchange coupling magnetic field by anti-ferromagnetic material.

Another object of the present invention is to provide a method and an apparatus for accurate measuring a bias magnetic field (longitudinal bias magnetic field) for controlling magnetic domains in a MR element with shield layers.

According to the present invention, a method for measuring bias magnetic field for controlling magnetic domain (longitudinal bias magnetic field) of a MR element has the step of applying an external measurement magnetic field onto the MR element which is biased with the magnetic filed for controlling the magnetic domain (longitudinal bias magnetic field) in parallel to the direction of the bias magnetic field, the step of measuring $\rho$-H loop of the MR element (output resistance of MR element versus magnetic field strength loop) under the application of the external measurement magnetic field, and the step of determining a shifted amount of the measured $\rho$-H loop.

Under the application of an external magnetic field in parallel to the direction of the longitudinal bias magnetic field, measurement of the $\rho$-H loop and determination of the shifted amount of the $\rho$-H loop are executed. Thus, an accurate strength of the longitudinal bias magnetic field in a MR element biased with exchange coupling magnetic field by anti-ferromagnetic material, such as TMR element or GMR element for example spin valve MR element, can be correctly obtained. Also, the shifted amount of the $\rho$-H loop can be detected even when an externally applied magnetic field is absorbed in a certain range by the shield layers, and hence the longitudinal bias magnetic field can be accurately measured in an actual MR element with the shield layers.

By this measurement method, since the longitudinal bias magnetic field of a TMR element and a GMR element such as a spin valve MR element can be correctly and accurately estimated, identification of Barkhousen noise and output level degradation of these element becomes easier. In general, processes of cutting wafer into bars, dicing bar into individual slider pieces and polishing may cause degradation of magnetic field strength of hard magnet. However, according to the present invention, manufacturing problems of degraded magneto-electric conversion characteristics of assembled magnetic heads can be avoided by precise measurement of their longitudinal bias magnetic field strength.

It is preferred that the measuring step includes the step of measuring the $\rho$-H loop under heating the MR element at high temperature. In this case, the heating may be done by joule heat of an electrical current flow applied to the MR element, or the heating may be done by an external heat-up equipment. If the MR element is heated to high temperature by joule heat of the current flowing there through, it enables temporal break of pinned state of the MR element only under test on a wafer, and thus no affectation onto other MR elements is resulted.

It is preferred that the MR element is a MR element which is biased with exchange coupling magnetic field by anti-ferromagnetic material, and that the heating is done to a temperature higher than the blocking temperature of the anti-ferromagnetic material. By such higher temperature heating, the pinned state of the MR element can be temporally broken, and measurement error due to pinning rotation can be eliminated. In addition, the measurement can be possible by comparatively small magnetic field strength without affecting the magnetization of the used hard magnets for the longitudinal bias magnetic field generation.

It is preferred that the determining step includes the step of obtaining a difference value between an absolute value of positive magnetic field strength and that of negative magnetic field strength when a resistance of the MR element is at a predetermined value in the measured $\rho$-H loop, the obtained difference value corresponding to the shifted amount of the measured $\rho$-H loop.

It is also preferred that the external measurement magnetic field has a strength which is enough to saturate the $\rho$-H loop, and/or the external measurement magnetic field is high frequency magnetic field or DC magnetic field.

According to the present invention, also an apparatus for measuring bias magnetic field for controlling magnetic domain of a MR element has means for applying an external measurement magnetic field onto the MR element which is biased with a magnetic filed for controlling the magnetic domain in parallel to the direction of the bias magnetic field, means for measuring $\rho$-H loop of the MR element under the application of the external measurement magnetic field, and means for determining a shifted amount of the measured $\rho$-H loop.

It is preferred that the apparatus further has means for heating the MR element at high temperature when the $\rho$-H loop is measured. In this case, the heating means may include means for heating the MR element itself by joule heat of an electrical current flow applied thereto, or an external heat-up equipment externally applying heat to the MR element.

It is also preferred that the MR element is a MR element which is biased with exchange coupling magnetic field by anti-ferromagnetic material, and that the heating means includes means for heating the MR element to a temperature higher than the blocking temperature of the anti-ferromagnetic material. By such higher temperature heating, the pinned state of the MR element can be temporally broken, and measurement error due to pinning rotation can be eliminated. In addition, the measurement can be possible by comparatively small magnetic field strength without affecting the magnetization of the used hard magnets for the longitudinal bias magnetic field generation.

It is preferred that the determining means includes the means for obtaining a difference value between an absolute value of positive magnetic field strength and that of negative magnetic field strength when a resistance of the MR element is at a predetermined value in the measured $\rho$-H loop, the obtained difference value corresponding to the shifted amount of the measured $\rho$-H loop.

It is also preferred that the applying means includes means for applying external measurement magnetic field with a strength which is enough to saturate the $\rho$-H loop, and/or the applying means includes means for applying external measurement magnetic field of high frequency magnetic field or DC magnetic field.

Further objects and advantages of the present invention will be apparent from the following description of the preferred embodiments of the invention as illustrated in the accompanying drawings.

BRIEF DESCRIPTION OF THE DRAWINGS

FIGS. 5a to 5g illustrate how the magnetic domain control bias is measured in the embodiment shown in FIG. 3;

DESCRIPTION OF THE PREFERRED EMBODIMENTS

Figure 2:
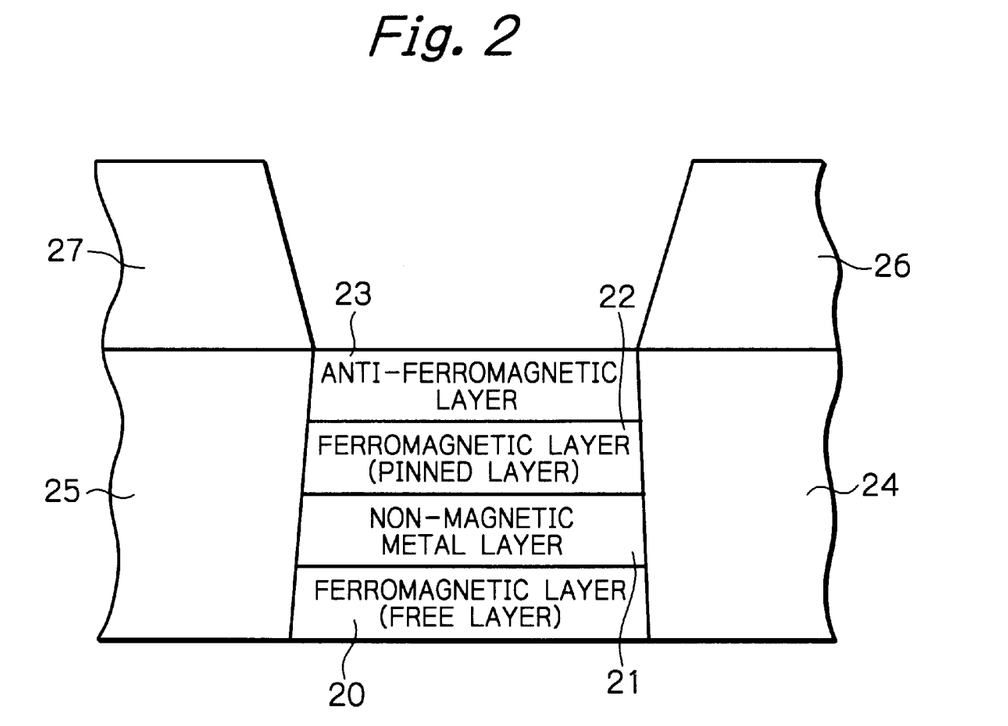
FIG. 2 shows a cross sectional view schematically illustrating a basic structure of a spin valve MR element as an example of a MR element biased by an anti-ferromagnetic material layer, which relates to the present invention.

FIG. 2 schematically illustrates a basic structure of a spin valve MR element as an example of a MR element biased by an anti-ferromagnetic material layer, which relates to the present invention.

In the figure, reference numerals 20 and 22 denote two ferromagnetic thin-film layers. These two ferromagnetic thin-film layers 20 and 22 are separated each other and sandwich a non-magnetic metal layer 21. On the ferromagnetic layer 22, an anti-ferromagnetic thin-film layer 23 is deposited, and the exchange bias magnetic field by exchange coupling at the interface of these layers 23 and 22 is applied to the ferromagnetic thin-film layer 22 (pinned layer). Thus, the magnetization direction of the layer 22 is pinned. The ferromagnetic thin-film layer 20 is not affected by the exchange bias magnetic field, so it is called as a free layer. At the both edges of the multi-layered spin valve structure in the track width direction, adjacently hard magnet layers 24 and 25 for the longitudinal bias magnetic field are formed and lead conductor layers 26 and 27 are also attached.

Figure 3:
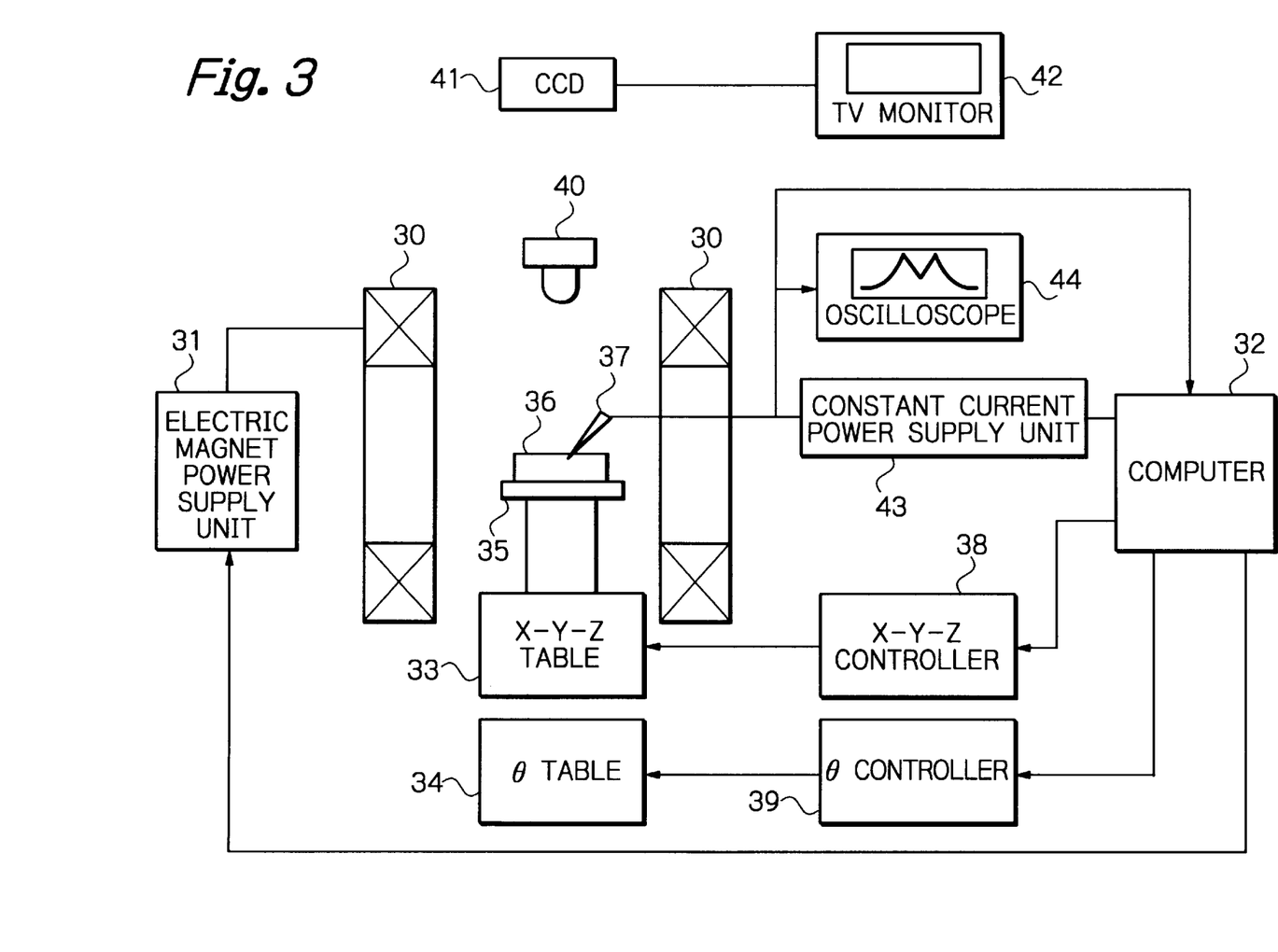
FIG. 3 shows a block diagram schematically illustrating an apparatus for measuring bias magnetic field for controlling magnetic domain of the spin valve MR element as a preferred embodiment of the present invention.

FIG. 3 illustrates an apparatus for measuring magnetic domain control bias of a spin valve MR element as a preferred embodiment according to the present invention.

In the figure, reference numeral 30 denotes an electric magnet with no core, namely Hermhortz coil, to generate measurement magnetic field applied onto a spin valve MR element to measure its longitudinal bias magnetic field. This electric magnet 30 is placed so that its axis is parallel with the horizon. The electric magnet 30 is electrically connected with a power supply unit 31 controlled by commands from a computer 32. Inside the electric magnet 32, there is a sample stage 35 which is placed on an X-Y-Z table 33 and a θ table (turn table) 34 under the table 33. On the sample stage 35, a wafer 36, on which a great number of spin valve MR elements are formed, is temporally fixed for the measurement.

In case that the longitudinal bias magnetic field of each MR element of a head block cut from the wafer into bar shaped block to have the aligned spin valve MR elements and executed the gap depth processing, or that the longitudinal bias magnetic field of an individually separated MR element, this sample is placed on the sample stage 35 instead of the wafer 36.

A probe pins assembly 37 is placed by a fixture to make electrical contact with the output pads of the MR element, the probe pins assembly 37 and the output pads are aligned by the X-Y-Z table 33 and its X-Y-Z table controller 38, and by the θ table (turn table) 34 and its θ table controller 39. The alignment of the probe pins assembly 37 and the output pads on the sample 36 can be monitored by a TV monitor display which shows the image captured by a CCD image sensor 41 through an optical device 40.

A constant current power supply unit 43 is electrically connected with the probe pins assembly 37 to supply sense current $I_s$ to the spin valve MR elements. And also the probe pins assembly 37 is electrically connected with an oscilloscope 44 to display the output voltage of the spin valve MR element and with the computer 32 which executes A/D conversion of the output voltage and data analysis.

The electric magnet power supply unit 31, the X-Y-Z table controller 38, the θ table controller 39 and the constant current power supply 43 are connected with the computer 32, and controlled under commands from the computer 32.

Figure 4:
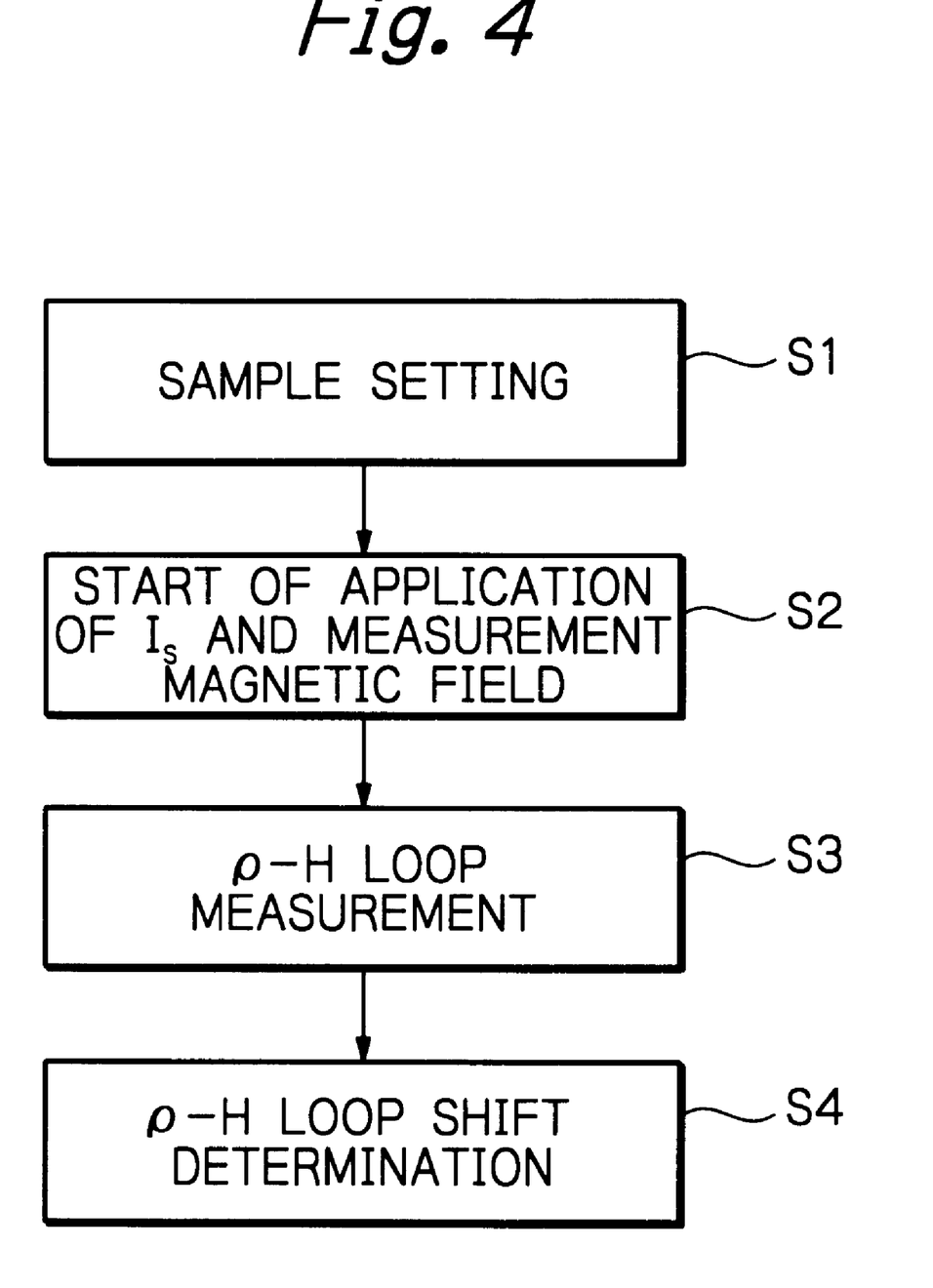
FIG. 4 shows a flow chart of a part of computer program for the measurement apparatus in the embodiment shown in FIG. 3.

FIG. 4 illustrates the control program of the computer 32 for the measurement apparatus in the embodiment shown in FIG. 3. Hereinafter, by using this FIG. 4, the details of the measurement method of the longitudinal bias magnetic field will be explained.

At step S1 in FIG. 4, a sample 36 which is a wafer to be measured (hereinafter a wafer sample is used in the explanation) is placed on the sample stage 35. The sample wafer 36 is placed and fixed so that the measurement magnetic field by the electric magnet 30 is applied in parallel with the direction of the track width of MR elements on the wafer sample 36. At the same time, the position alignment of the output pads of the spin valve MR element to be measured on the sample wafer 36 and probe pins assembly 37 is done. For this process, a well known technique of alignment by the X-Y-Z table 33 movement and the θ table 34 rotation which are controlled by commanding the X-Y-Z table controller 38 and the θ table controller 39 is used.

At the following step S2, application of sense current in a range of about 12–20 mA onto the spin valve MR element on the sample wafer 36 is started, and application of the ρ-H loop measurement magnetic field onto the sample wafer 36 is started. This ρ-H loop measurement magnetic field is generated by Hermhortz coil 30 and has polarity which changes alternately and periodically like sine waveform. Preferably, this magnetic field is a high frequency sine waveform. The direction of the applied measurement magnetic field is in parallel with the direction of the track width of the spin valve MR element.

At step S3, the ρ-H loop (resistance-magnetic field strength loop of the MR element) measurement is done. The measurement method of such ρ-H loop is well known and so the details are omitted here. Simply stating, the measurement is executed by applying the measurement magnetic field and the sense current and then by measuring the resistance at the output nodes of the spin valve MR element. The strength of the applied measurement magnetic field should be enough to saturate the ρ-H loop characteristics, preferably its peak level is in a range of about 200–500 Oe.

At step S4, based on the measured data of the ρ-H loop, the shifted amount of the loop is determined. More specifically, the shifted amount of the ρ-H loop is calculated by a equation $(H_1-H_2)/2$, where $H_1$ and $H_2$ are an absolute value of the positive magnetic field strength and an absolute value of the negative magnetic field strength when the output resistance value of the MR element becomes equal to a predetermined value in a range of 20–80% of the maximum value of the output resistance.

Through the steps S1 to S4 described above, the shifted amount along the magnetic field direction of the ρ-H loop is determined, and this amount corresponds to the strength of the longitudinal bias magnetic field.

FIGS. 5a to 5g illustrate how the longitudinal bias magnetic field (the magnetic domain control bias) of a spin valve MR element is measured in the embodiment shown in FIG. 3.

Figures 5A, 5B, 5C, 5E, 5F, 5G:
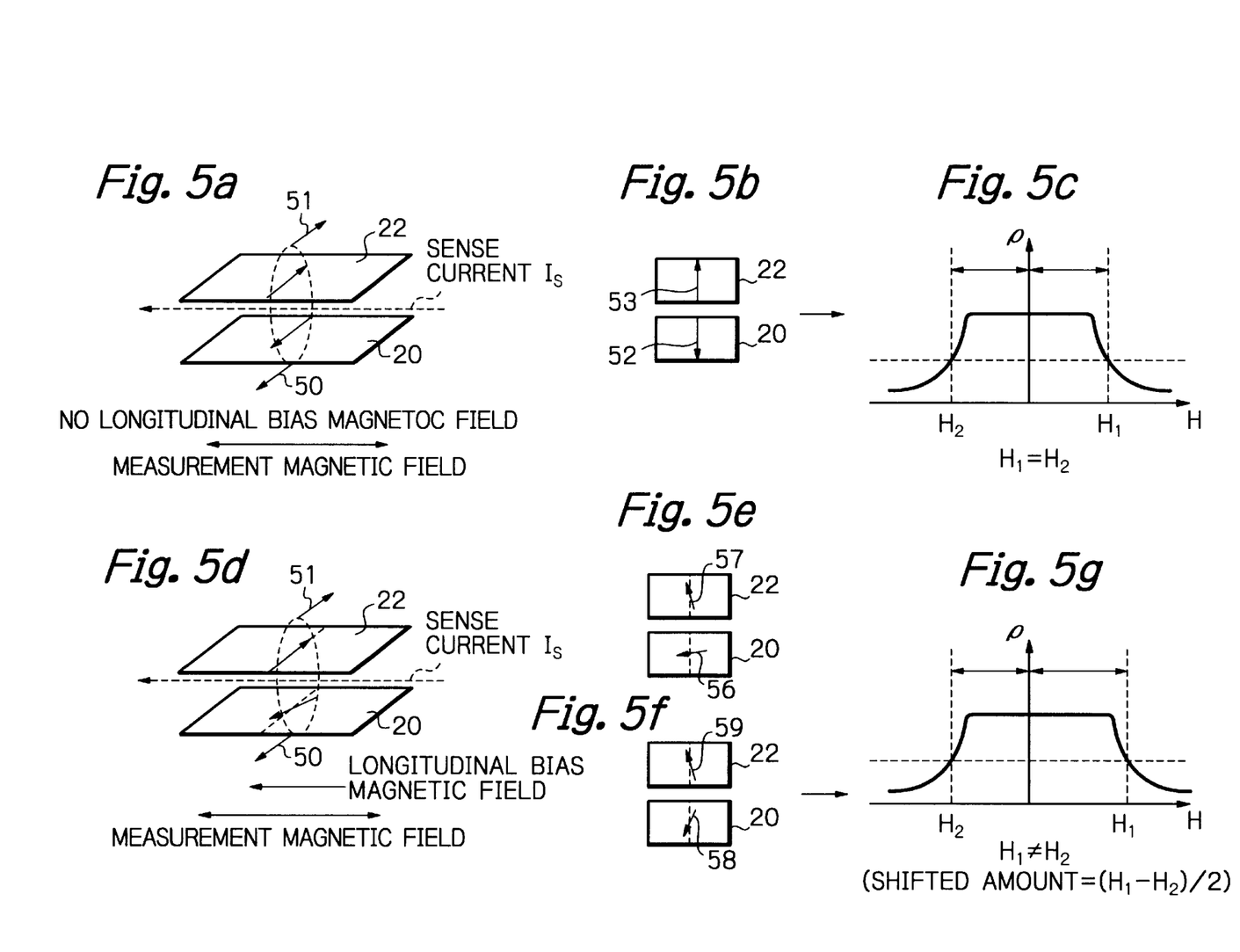

First, the ρ-H loop of the spin valve MR element with no longitudinal bias magnetic field is explained. This is not happened in an actual spin valve MR element. As shown in FIG. 5a, a sense current $I_s$ is started to flow in a one direction (assist direction) and an external magnetic field for the ρ-H loop measurement is applied toward the track width direction.

To the free layer 20 and the pinned layer 22, the magnetic field 50 and 51 generated by the sense current $I_s$ is applied, respectively. When the ρ-H loop measurement magnetic field is zero, the free layer 20 and the pinned layer 22 are magnetized in the directions 52 and 53 as shown in FIG. 5b. Thus, if ρ-H loop measurement of a spin valve MR element with no longitudinal bias magnetic field is done, the measured ρ-H loop curve becomes symmetrical with respect to the point at zero level of the externally applied magnetic field for the measurement as shown in FIG. 5c. Namely, the absolute value of the positive magnetic field strength $H_1$ and that of the negative magnetic field strength $H_2$ at a specifically defined value of the output resistance of the MR element in a range of 20–80% of its maximum value are equal to with each other ($H=H_2$).

Here, the ρ-H loop measurement of a spin valve MR element with the longitudinal bias magnetic field is explained. In this case as shown in FIG. 5d, a sense current $I_s$ is started to flow in a one direction (assist direction) and an external magnetic field for the ρ-H loop measurement is applied toward the track width direction.

In an actual spin valve MR element, the magnetization direction of the pinned layer may be rotated in some reasons due to affects of thermal treatment processes. The rotation of the magnetization direction of the pinned layer means that the magnetization direction (pinned direction) differs from the MR height direction which is correct pinned direction obtained by the exchange coupling with the anti-ferromagnetic magnetic material layer 23. The free layer 20 is initially magnetized toward the direction of the longitudinal bias magnetic field.

In this embodiment, a sense current $I_s$ of about 12 mA is flowed, and the joule heat by the current flow increases the temperature of the anti-ferromagnetic thin-film layer 23 equal to or more than its blocking temperature. Thus, the exchange coupling is weakened and the magnetization direction of the pinned layer 22 can comparatively freely rotate in accordance with the applied external magnetic field. As a result, the magnetization direction of the free layer 20 and that of the pinned layer 22 will rotate toward anti-parallel directions with each other by the magnetic fields 54 and 55 generated by the current flow $I_s$.

However, since there is the longitudinal bias magnetic field, these magnetization directions will not be in just anti-parallel as shown in FIGS. 5e and 5f. FIG. 5e illustrates these magnetization directions 56 and 57 in the free layer 20 and the pinned layer 22, respectively, under the condition of the sense current $I_s$=0. FIG. 5f illustrates these magnetization directions 58 and 59 in the free layer 20 and the pinned layer 22, respectively, under the condition of the sense current $I_s$=12 mA.

The magnetic field strength by the sense current $I_s$ of 12 mA is in a range of about 50–60 Oe, and the ordinal exchange coupling bias magnetic field strength by the anti-ferromagnetic material layer 23 is in a range of about 300–500 Oe. Therefore, in comparison with the measurement under room temperature, temporal breaking of the exchange coupling by the joule heat due to the sense current flow can rotate the magnetization direction the pinned layer more freely.

Under the condition of flowing a sense current $I_s$ of 12 mA and thus temporal breaking of the pinning by increasing the temperature of the anti-ferromagnetic material layer 23 equal to or more than the blocking temperature due to the sense current, the ρ-H loop measurement is done by applying an external magnetic field of the strength of about 500 Oe that is enough to saturate the ρ-H loop, toward the direction of the track width. The measured ρ-H loop has a shape shifted along the axis of the applied magnetic field as shown in FIG. 5g. Namely, in this measured ρ-H loop, the absolute value of the positive magnetic field strength $H_1$ and that of the negative magnetic field strength $H_2$ at a specifically defined value of the output resistance of the MR element in a range of 20–80% of the maximum value differs with each other, and the shifted amount of the ρ-H loop is equivalent to a half of the difference calculated by a equation $(H_1-H_2)/2$. In this case, the shifted amount is equivalent to the strength of the longitudinal bias magnetic field, because the magnetic field applied toward the direction of the track width is only the longitudinal bias magnetic field.

According to this embodiment, as described above, the strength of the longitudinal bias magnetic field in a MR element biased with exchange coupling magnetic field by anti-ferromagnetic material such as a GMR element for example a spin valve MR element or as a TMR element can be correctly and accurately measured. Also, since a shifted amount of the ρ-H loop can be detected even when an externally applied magnetic field is absorbed in a certain range by shield layers, the longitudinal bias magnetic field can be correctly measured in an actual MR element inserted between the shield layers.

Since the longitudinal bias magnetic field of the TMR element or the GMR element such as the spin valve MR element can be correctly estimated according to this measurement method, the cause of identification of Barkhousen noise and of output level degradation in the TMR or GMR element can be easily found.

In general, processes of cutting wafers into bars, dicing the bar into individual slider pieces and polishing may cause degradation of magnetic field strength of hard magnet, and hence manufacturing problems of degraded magneto-electric conversion characteristics of assembled magnetic heads due to less longitudinal bias magnetic field may occur. However, according to this measurement method, since the longitudinal bias magnetic field can be correctly measured, the aforementioned problems can be effectively prevented from occurring.

Furthermore, the information of the strength of the longitudinal bias magnetic field and its distribution of the MR elements integrated on the wafer is very useful to optimize the hard magnet material and its thickness in designing a magnetic head, and to do quality control of distribution and degradation of the longitudinal bias magnetic field during the manufacturing process.

According to this embodiment, a sense current flowing and resultant joule heating give temporally break of the pinning of the pinned layer by increased temperature of the anti-ferromagnetic material layer 23 equal to or more than the blocking temperature. Thus, an error of the longitudinal bias magnetic field measurement due to the component of the exchange coupling bias magnetic field caused by rotation of the magnetization of the pinned layer can be minimized. Measurement by applying comparatively small level of an external magnetic field in a range of about 200–500 Oe is possible. Such small level of the applied external magnetic field does not affect the magnetic characteristics of the hard magnet layer that generates the longitudinal bias magnetic field. Also, since only one of MR elements on a wafer can be heated by the sense current to temporally break its pinned state, no affectation onto other MR elements is resulted.

In the above-mentioned embodiment, the temperature of the anti-ferromagnetic material is increased equal to or more than the blocking temperature by joule heating of a sense current flowing. However, there is another way of heating the anti-ferromagnetic material at the temperature equal to or more than the blocking temperature by external heat-up equipment such as an oven chamber for the measurement.

In the above mentioned embodiment, also, each MR element is structured by the hard magnet layers for generation of the longitudinal bias magnetic field, as a matter of course, the measurement method can be applied to a MR element which is structured by the stacked ferromagnetic layer and anti-ferromagnetic layer for generation of the exchange coupling bias magnetic field as the longitudinal bias magnetic field. Furthermore, in this embodiment, a high frequency AC magnetic field is used as the measurement magnetic field, but also a DC magnetic field can be used. However, in evaluation process of the ρ-H loop, a high frequency AC magnetic field is necessary in order to emulate the magnetic field under actual application environment.

It is desired that the measurement of magnetic domain control bias of a spin valve MR element is done during the period of characterization and evaluation process from the completion of deposition and magnetization of the hard magnet layers in the wafer process and before shipment of the magnetic head assembly with the spin valve MR element. There is a phenomenon in which the magnetized hard magnet layers are degraded at the manufacturing processes of wafer cutting to bars, bar dicing to individual slider pieces, and polishing. Therefore, if a magnetic head is assembled with such degraded hard magnet layer, a failure of magneto-electric conversion characteristics may be caused. However, if the longitudinal bias magnetic field measurement is done at sampling basis after each manufacturing process and re-magnetization onto the hard magnet layers is implemented when degradation of the field is observed, manufacturing of faulty components can be prevented.

Figure 6:
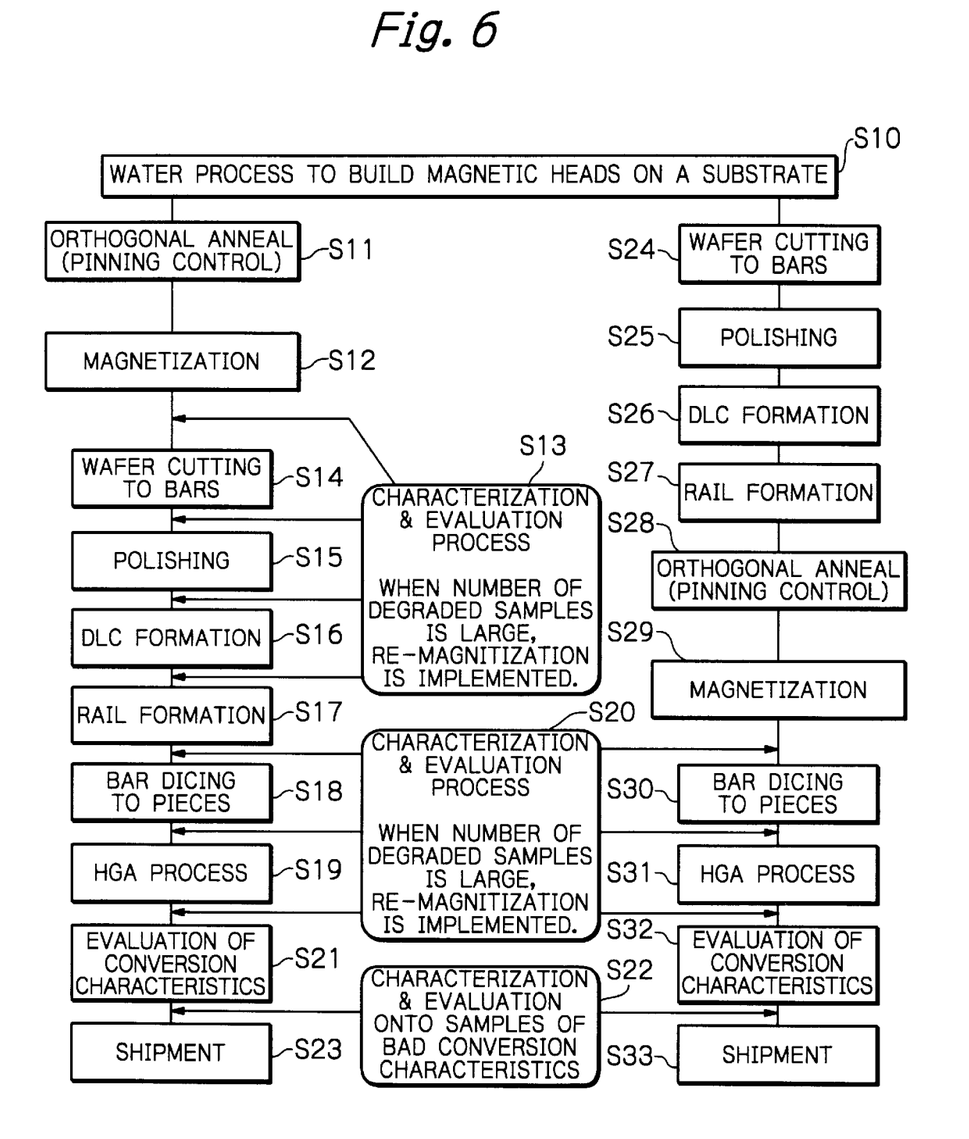
FIG. 6 shows a flow chart illustrating when the measurement of the magnetic domain control bias according to the present invention is actually executed in a manufacturing process of MR elements.

FIG. 6 illustrates when the measurement of the magnetic domain control bias according to the present invention is actually executed in a manufacturing process of MR elements.

In the figure, step S10 shows wafer fabrication process to form a large number of magnetic heads on a wafer by a thin-film integration method. After this wafer process S10, a temperature annealing under a magnetic field (orthogonal annealing) for magnetic characteristics control at step S11 follows, then at step S12, magnetization of hard magnet layers is done. After this magnetization, at step S13, characterization and evaluation process may be implemented. At this process, measurement of magnetic domain control bias of a MR element in accordance with this embodiment is done. If degradation of the magnetic domain control bias of a MR element is found (when the number of degraded sample MR elements is large and exceeds a specific criterion), re-magnetization onto the hard magnet layers will be implemented.

The next step S14 is a process of wafer cutting to head blocks or bars where a plurality of magnetic heads are aligned, step S15 a polishing process for controlling MR height and others, and step S16 a deposition and forming process of DLC (Diamond Like Carbon) layer. After these processes, characterization and evaluation process shown by the step S13 may be implemented to measure magnetic domain control bias of a MR element in accordance with this embodiment. If degradation of the magnetic domain control bias of the MR element is found (when the number of degraded sample MR elements is large and exceeds a specific criterion), re-magnetization onto the hard magnet layers will be implemented.

The next step S17 is a process for forming rails on the bar, step S18 a process of bar dicing to individual magnetic head slider pieces, step S19 a process of making a HGA (Head Gimbals Assembly) or a magnetic head assembly attaching the individual magnetic head slider onto a gimbal. After these processes, characterization and evaluation process at step S20 may be implemented to measure magnetic domain control bias of a MR element in accordance with this embodiment. If degradation of the magnetic domain control bias of the MR element is found (when the number of degraded sample MR elements is large and exceeds a specific criterion), re-magnetization onto the hard magnet layers will be implemented.

The next step S21 is a process to finally evaluate the magneto-electric conversion characteristics (or ρ-H loop characteristics) of magnetic head assemblies. If it is decided that the magnetic head assembly has bad magneto-electric conversion characteristics, the measurement of the magnetic domain control bias of MR element is done at step S22. Then, if degradation is found (when the number of degraded sample MR elements is large and exceeds a specific criteria), re-magnetization onto its hard magnet layers will be implemented. At step S23, then, the magnetic head assemblies manufactured in accordance with the process flow described above are to be shipped. In the manufacturing flow, it is not necessary to do the measurement of the magnetic domain control bias at all steps, but it is enough to do the measurement at least one step.

In the case that a process of temperature annealing under a magnetic field (orthogonal annealing) (step S28) and a process of magnetization (step S29) are done after a process of wafer cutting to bars (step S24), a process of polishing for control MR height (step S25), a process of deposition of DLC layer (step S26), and a process of forming rail on the bar (step S27), the characterization and evaluation process at the step S20 and the measurement of the magnetic domain control bias may be done after the magnetization process (step S29), after the process of dicing to slider pieces (step S30), or after the process of HGA (step S31). If degradation of the magnetic domain control bias of a MR element is found (when the number of degraded sample MR elements is large and exceeds a specific criterion), re-magnetization onto the hard magnet layers will be implemented.

At the final evaluation process of magneto-electric conversion characteristics (or ρ-H loop characteristics) of a magnetic head assembly (step S32), if it is decided that the magnetic head assembly has bad magneto-electric conversion characteristics, the measurement of the magnetic domain control bias of MR element is done at step S22. Then, if degradation is found (when the number of degraded sample MR elements is large and exceeds a specific criteria), re-magnetization onto its hard magnet layers will be implemented. At step S33, then, the magnetic head assemblies manufactured in accordance with the process flow described above are to be shipped. In the manufacturing flow, it is not necessary to do the measurement of the magnetic domain control bias at all steps, but it is enough to do the measurement at least one step.

FIRST EXAMPLE

Figure 7A:
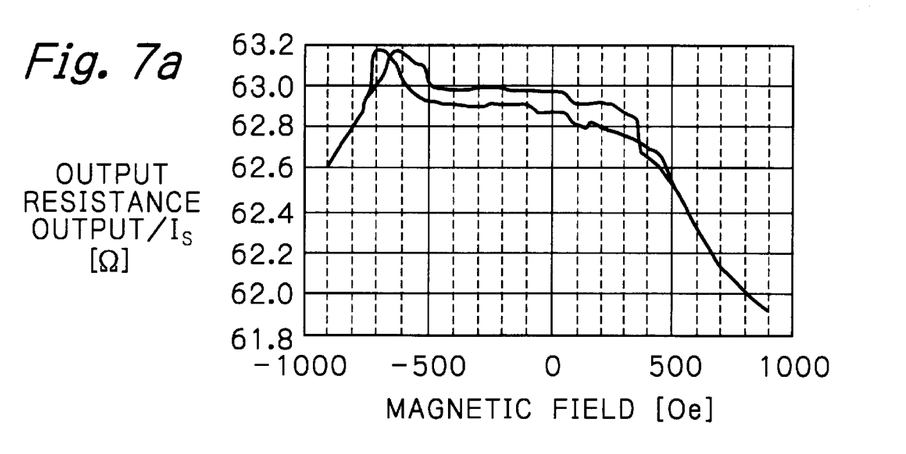
FIGS. 7a to 7c show ρ-H loop characteristics obtained in a first example of the measurement of the magnetic domain control bias according to the present invention.
Figure 7B:
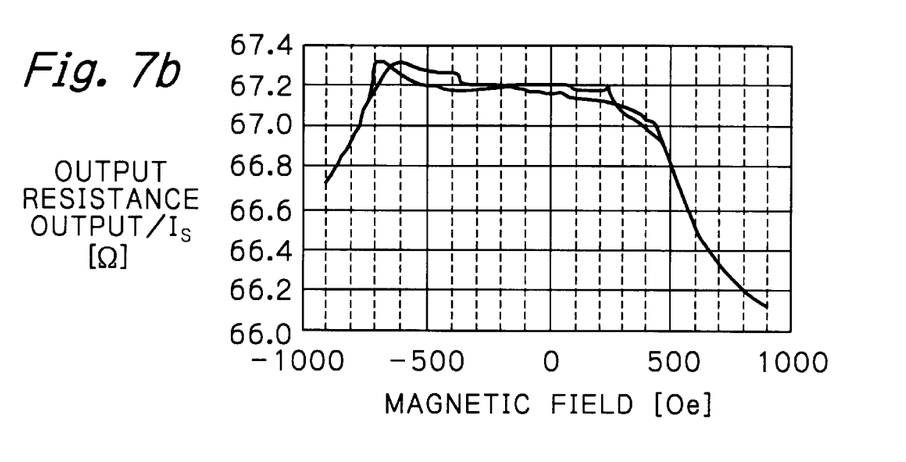
Figure 7C:
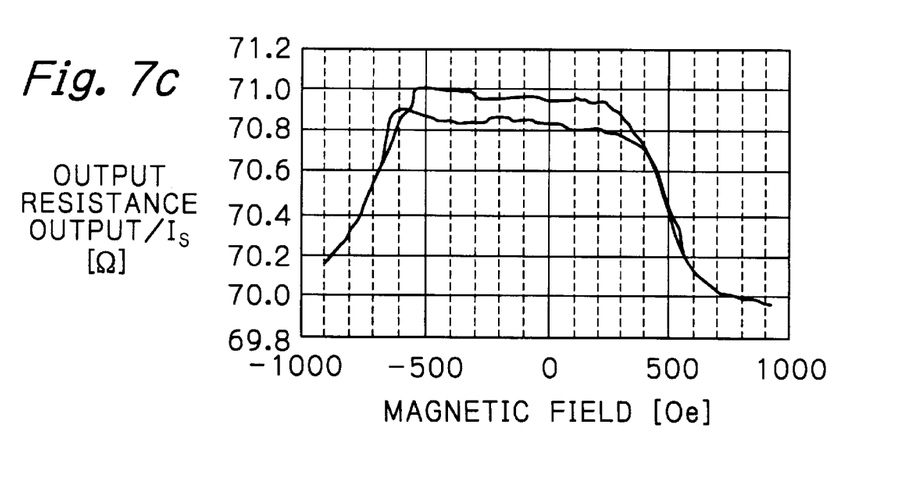

FIGS. 7a to 7c show ρ-H loop characteristics obtained in a first example of the measurement of the magnetic domain control bias according to the present invention. FIG. 7a represents the ρ-H loop under the sense current of $I_s$=5 mA, FIG. 7b under the sense current of $I_s$=10 mA and FIG. 7c under the sense current of $I_s$=16 mA, respectively.

This first example is a case of a spin valve MR element (with no shield layer) with a spin valve multi-layered structure which consists of Ta layer (thickness 5 nm)/NiFe layer (8 nm)/Co layer (1 nm)/Cu layer (2.7 nm)/Co layer (20 nm)/RuRhMn layer (11 nm)/Ta layer (5 nm). To the spin valve multi-layered structure, longitudinal bias magnetic field is applied from hard magnet layers of PtCo (thickness 100 nm). The strength of the externally applied measurement magnetic field is 900 Oe, and the direction of this applied magnetic field is in parallel with the direction of the longitudinal bias magnetic field or the track width direction.

Comparing FIGS. 7a to 7c with each other, it is apparent that the loop becomes symmetrical in accordance with the increase of the sense current. This is because the magnetization of the pinned layer can comparatively freely rotate against the externally applied magnetic field due to joule heat of the sense current flow. When the sense current is $I_s$=16 mA, an almost symmetrical loop is obtained. In this ρ-H loop, the strength of the externally applied magnetic filed is 550.4 Oe in the positive direction and −863.2 Oe in the negative direction, when the output resistance becomes 70.2 Ω which is at the point of 80% decrease of the maximum output resistance value. Therefore, this loop is shifted with 156.4 Oe toward the negative direction, and this shift value represents the strength of the longitudinal bias magnetic field.

SECOND EXAMPLE

Figure 8A:
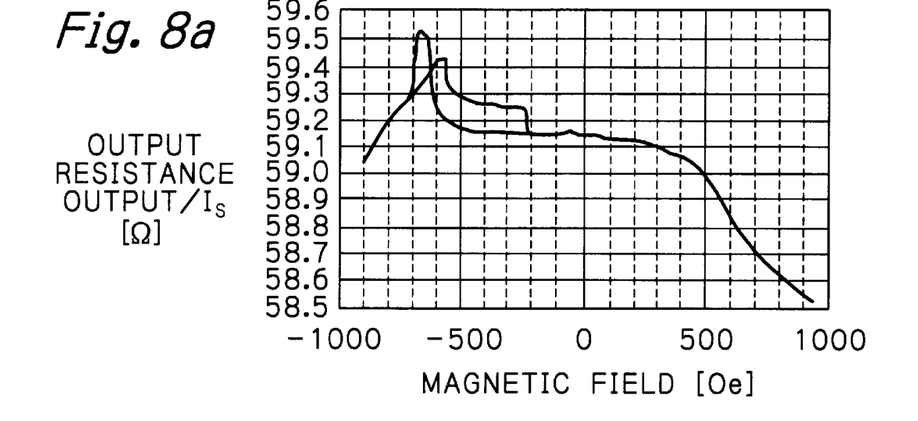
FIGS. 8a to 8c show ρ-H loop characteristics obtained in a second example of the measurement of the magnetic domain control bias according to the present invention.
Figure 8B:
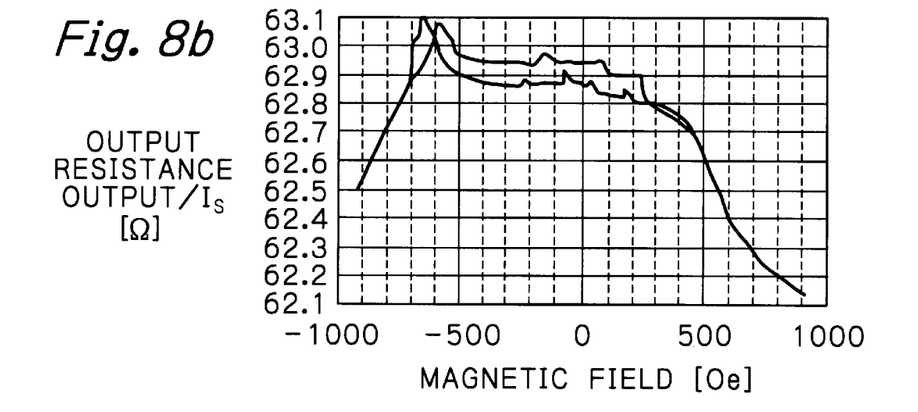
Figure 8C:
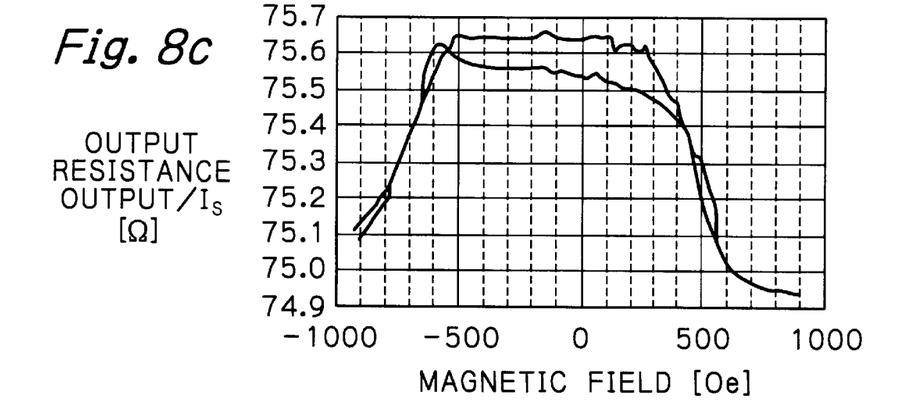

FIGS. 8a to 8c show ρ-H loop characteristics curves obtained by a second example of the measurement of the magnetic domain control bias according to the present invention. FIG. 8a represents the loop under the sense current of $I_s$=5 mA, FIG. 8b under the sense current of $I_s$=10 mA and FIG. 8c under the sense current of $I_s$=17 mA, respectively.

This second example of the measurement was done onto different MR element sample on the same wafer used in the first example.

Comparing FIGS. 8a to 8c with each other, it is apparent that the loop becomes symmetrical in accordance with the increase of the sense current. This is because the magnetization of the pinned layer can comparatively freely rotate against the externally applied magnetic field due to joule heat of the sense current flow. When the sense current is $I_s$=17 mA, an almost symmetrical loop is obtained. In this ρ-H loop, the strength of the externally applied magnetic filed is 548.0 Oe in the positive direction and −859.2 Oe in the negative direction, when the output resistance becomes 75.1 Ω which is at the point of 80% decrease of the maximum output resistance value. Therefore, this loop is shifted with 155.6 Oe toward the negative direction, and this shift value represents the strength of the longitudinal bias magnetic field.

THIRD EXAMPLE

Figure 9A:
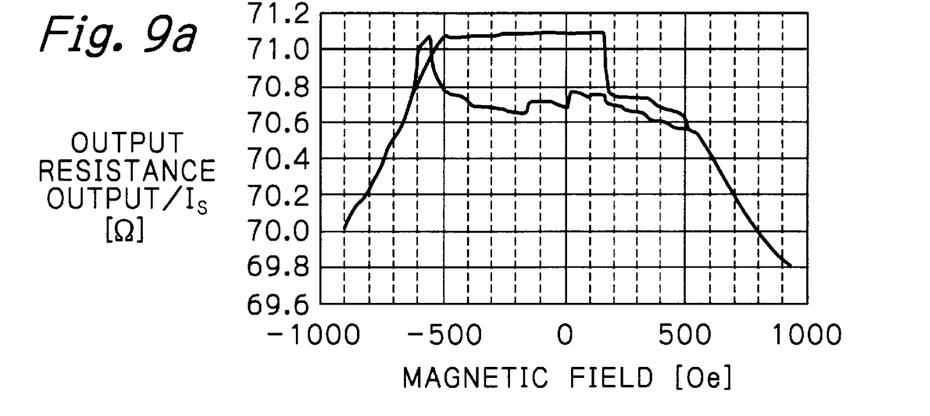
FIGS. 9a to 9c show ρ-H loop characteristics obtained in a third example of the measurement of the magnetic domain control bias according to the present invention.
Figure 9B:
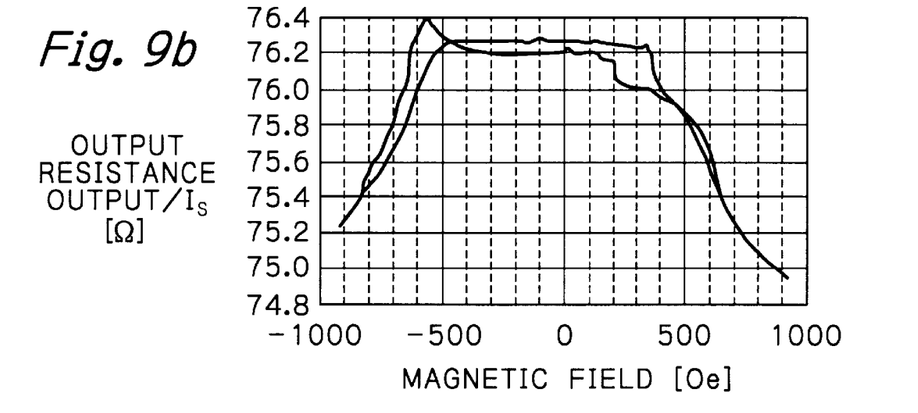
Figure 9C:
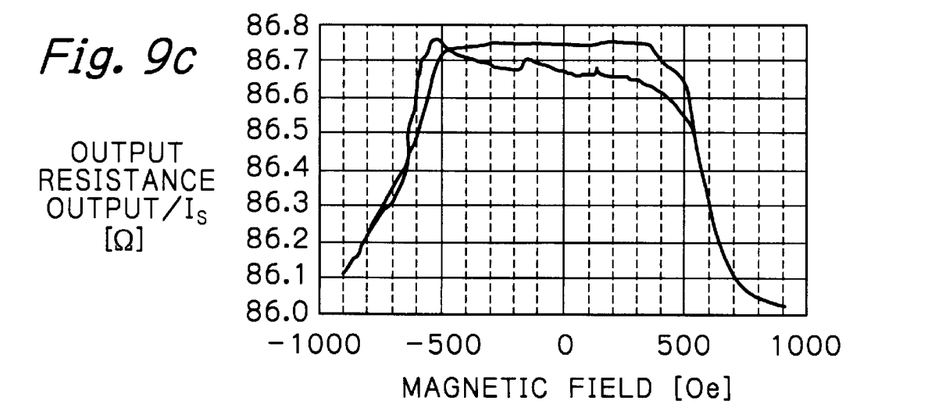

FIGS. 9a to 9c show ρ-H loop characteristics curves obtained by a third example of the measurement of the magnetic domain control bias according to the present invention. FIG. 9a represents the loop under the sense current of $I_s$=5 mA, FIG. 9b under the sense current of $I_s$=10 mA and FIG. 9c under the sense current of $I_s$=15 mA, respectively.

This third example is a case of a spin valve MR element (with no shield layer) with a spin valve multi-layered structure which consists of Ta layer (thickness 5 nm)/NiFe layer (8 nm)/Co layer (1 nm)/Cu layer (2.7 nm)/Co layer (20 nm)/RuRhMn layer (11 nm)/Ta layer (5 nm). To the spin valve multi-layered structure, longitudinal bias magnetic field is applied from hard magnet layers of PtCo (thickness 500 nm). The strength of the externally applied measurement magnetic field is 900 Oe, and the direction of this applied magnetic field is in parallel with the direction of the longitudinal bias magnetic field or the track width direction.

Comparing FIGS. 9a to 9c with each other, it is apparent that the loop becomes symmetrical in accordance with the increase of the sense current. This is because the magnetization of the pinned layer can comparatively freely rotate against the externally applied magnetic field due to joule heat of the sense current flow. When the sense current is $I_s$=15 mA, an almost symmetrical loop is obtained. In this ρ-H loop, the strength of the externally applied magnetic filed is 630.4 Oe in the positive direction and −801.6 Oe in the negative direction, when the output resistance becomes 86.2 Ω which is at the point of 80% decrease of the maximum output resistance value. Therefore, this loop is shifted with 85.6 Oe toward the negative direction, and this shift value represents the strength of the longitudinal bias magnetic field.

FOURTH EXAMPLE

Figure 10A:
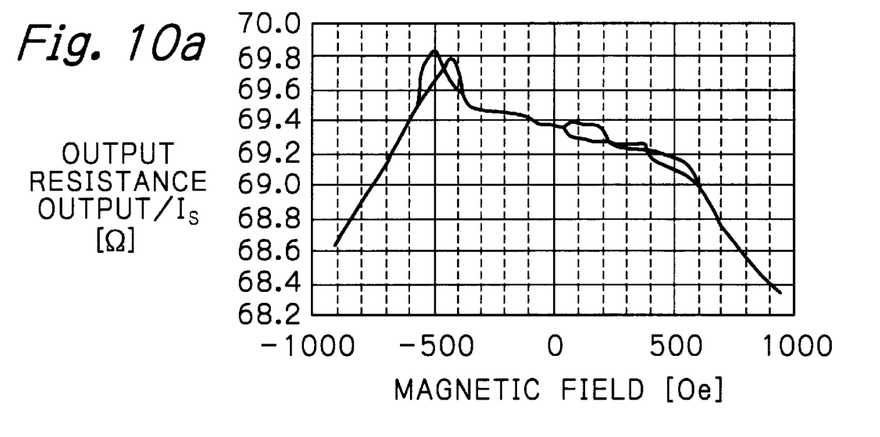
FIGS. 10a to 10c show ρ-H loop characteristics obtained in a fourth example of the measurement of the magnetic domain control bias according to the present invention.
Figure 10B:
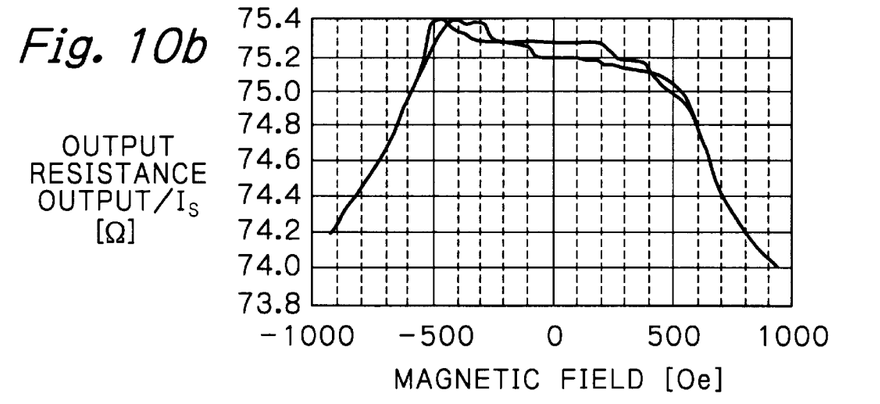
Figure 10C:
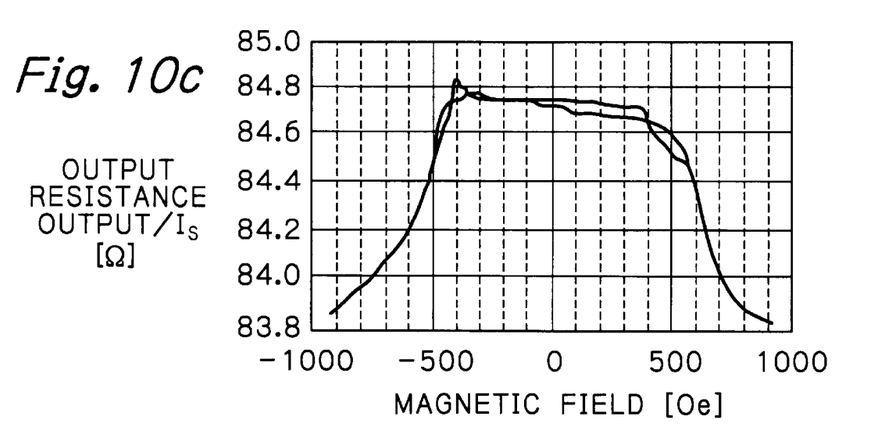

FIGS. 10a to 10c show ρ-H loop characteristics curves obtained by a fourth example of the measurement of the magnetic domain control bias according to the present invention. FIG. 10a represents the loop under the sense current of $I_s$=5 mA, FIG. 10b under the sense current of $I_s$=10 mA and FIG. 10c under the sense current of $I_s$=14 mA, respectively.

This fourth example is a case of a spin valve MR element (with no shield layer) with a spin valve multi-layered structure which consists of Ta layer (thickness 5 nm)/NiFe layer (8 nm)/Co layer (1 nm)/Cu layer (2.7 nm)/Co layer (20 m)/RuRhMn layer (11 nm)/Ta layer (5 nm). To the spin valve multi-layered structure, longitudinal bias magnetic field is applied from hard magnet layers of PtCo (thickness 200 nm). The strength of the externally applied measurement magnetic field is 900 Oe, and the direction of this applied magnetic field is in parallel with the direction of the longitudinal bias magnetic field or the track width direction.

Comparing FIGS. 10a to 10c with each other, it is apparent that the loop becomes symmetrical in accordance with the increase of the sense current. This is because the magnetization of the pinned layer can comparatively freely rotate against the externally applied magnetic field due to joule heat of the sense current flow. When the sense current is $I_s$=14 mA, an almost symmetrical loop is obtained. In this ρ-H loop, the strength of the externally applied magnetic filed is 694.8 Oe in the positive direction and −742.0 Oe in the negative direction, when the output resistance becomes 84.0 Ω which is at the point of 80% decrease of the maximum output resistance value. Therefore, this loop is shifted with 23.6 Oe toward the negative direction, and this shift value represents the strength of the longitudinal bias magnetic field.

Many widely different embodiments of the present invention may be constructed without departing from the spirit and scope of the present invention. It should be understood that the present invention is not limited to the specific embodiments described in the specification, except as defined in the appended claims.

What is claimed is:

1. A method for measuring bias magnetic field for controlling magnetic domain of a magnetoresistive effect element, said method comprising the steps of:

applying an external measurement magnetic field onto said magnetoresistive effect element which is biased with a magnetic field for controlling the magnetic domain in parallel to the direction of said bias magnetic field;

measuring ρ-H loop of said magnetoresistive effect element under the application of said external measurement magnetic field; and determining a shifted amount of the measured ρ-H loop.

2. The method as claimed in claim 1, wherein said measuring step includes the step of measuring the ρ-H loop under heating said magnetoresistive effect element at high temperature.

3. The method as claimed in claim 2, wherein said heating is done by joule heat of an electrical current flow applied to said magnetoresistive effect element.

4. The method as claimed in claim 2, wherein said heating is done by external heat-up equipment.

5. The method as claimed in claim 2, wherein said magnetoresistive effect element is a magnetoresistive effect element which is biased with exchange coupling magnetic field by anti-ferromagnetic material, and wherein said heating is done to a temperature higher than the blocking temperature of said anti-ferromagnetic material.

6. The method as claimed in claim 1, wherein said determining step includes the step of obtaining a difference value between an absolute value of positive magnetic field strength and that of negative magnetic field strength when a resistance of said magnetoresistive effect element is at a predetermined value in the measured ρ-H loop, the obtained difference value corresponding to the shifted amount of the measured ρ-H loop.

7. The method as claimed in claim 1, wherein said external measurement magnetic field has strength which is enough to saturate the ρ-H loop.

8. The method as claimed in claim 1, wherein said external measurement magnetic field is high frequency magnetic field or DC magnetic field.

9. An apparatus for measuring bias magnetic field for controlling magnetic domain of a magnetoresistive effect element, said apparatus comprising:

means for applying an external measurement magnetic field onto said magnetoresistive effect element which is biased with a magnetic field for controlling the magnetic domain in parallel to the direction of said bias magnetic field;

means for measuring ρ-H loop of said magnetoresistive effect element under the application of said external measurement magnetic field; and means for determining a shifted amount of the measured ρ-H loop.

10. The apparatus as claimed in claim 9, wherein said apparatus further comprises means for heating said magnetoresistive effect element at high temperature when the ρ-H loop is measured.

11. The apparatus as claimed in claim 10, wherein said heating means includes means for heating said magnetoresistive effect element itself by joule heat of an electrical current flow applied thereto.

12. The apparatus as claimed in claim 10, wherein said heating means includes an external heat-up equipment externally applying heat to said magnetoresistive effect element.

13. The apparatus as claimed in claim 10, wherein said magnetoresistive effect element is a magnetoresistive effect element which is biased with exchange coupling magnetic field by anti-ferromagnetic material, and wherein said heating means includes means for heating said magnetoresistive effect element to a temperature higher than the blocking temperature of said anti-ferromagnetic material.

14. The apparatus as claimed in claim 9, wherein said determining means includes the means for obtaining a difference value between an absolute value of positive magnetic field strength and that of negative magnetic field strength when a resistance of said magnetoresistive effect element is at a predetermined value in the measured ρ-H loop, the obtained difference value corresponding to the shifted amount of the measured ρ-H loop.

15. The apparatus as claimed in claim 9, wherein said applying means includes means for applying external measurement magnetic field with a strength which is enough to saturate the ρ-H loop.

16. The apparatus as claimed in claim 9, wherein said applying means includes means for applying external measurement magnetic field of high frequency magnetic field or DC magnetic field.

* * * * *